United States Patent
Chen et al.

(10) Patent No.: US 6,528,428 B1
(45) Date of Patent: Mar. 4, 2003

(54) METHOD OF FORMING DUAL DAMASCENE STRUCTURE

(75) Inventors: Tong-Yu Chen, Hsinchu (TW); Chan-Lon Yang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 16 days.

(21) Appl. No.: 09/638,416

(22) Filed: Aug. 14, 2000

(30) Foreign Application Priority Data

Aug. 7, 2000 (TW) ...................................... 089115834 A

(51) Int. Cl.$^7$ ............................................. H01L 21/311
(52) U.S. Cl. ........................ 438/700; 438/725; 438/745
(58) Field of Search ................................ 438/628–636, 438/637–640, 689, 692–693, 700, 706, 712, 745, 723–725

(56) References Cited

U.S. PATENT DOCUMENTS

| | | | | |
|---|---|---|---|---|
| 5,753,967 A | * | 5/1998 | Lin ............................. 257/635 |
| 6,156,648 A | * | 12/2000 | Huang ......................... 438/654 |
| 6,211,069 B1 | * | 4/2001 | Hu et al. .................... 438/637 |
| 6,251,774 B1 | * | 6/2001 | Harada et al. .............. 438/637 |
| 6,291,887 B1 | * | 9/2001 | Wang et al. ................ 438/637 |
| 6,297,149 B1 | * | 10/2001 | Stamper ..................... 438/700 |

OTHER PUBLICATIONS

Wolf et al., Silicon Processing for the VLSI Era, 1986, vol. 1, pp. 162–174, 182–195, 520–525, 529–531.*

* cited by examiner

*Primary Examiner*—Benjamin L. Utech
*Assistant Examiner*—Duy-Vu Deo

(57) ABSTRACT

A method of forming a dual damascene structure. A first dielectric layer, an etching stop layer, a second dielectric layer and a hard mask layer are sequentially formed over a substrate. Photolithographic and etching operations are conducted to remove a portion of the hard mask layer, the second dielectric layer, the etching stop layer and the first dielectric layer so that a via opening is formed. A conformal dielectric layer is formed on the surface of the hard mask layer and the interior surface of the via opening. An anisotropic etching operation is carried out to form spacers on the sidewalls of the via opening. A patterned photoresist layer is formed over the hard mask layer. Using the patterned photoresist layer as a mask, a portion of the second dielectric layer is removed to form a trench. The patterned photoresist layer is removed. Conductive material is deposited over the substrate to fill the via opening and the trench. Chemical-mechanical polishing is conducted to remove excess conductive material above the hard mask layer.

19 Claims, 6 Drawing Sheets

METHOD OF FORMING DUAL DAMASCENE STRUCTURE

CROSS-REFERENCE TO RELATED APPLICATION

This application claims the priority benefit of Taiwan application serial no. 89115834, filed Aug. 7, 2000.

BACKGROUND OF THE INVENTION

1. Field of Invention

The present invention relates to a method of forming a dual damascene structure. More particularly, the present invention relates to a method of forming a dual damascene opening capable of reducing the degree of interaction between low dielectric constant material and photoresist material.

2. Description of Related Art

Operating speed is often a principle consideration for customers when choosing a particular brand of semiconductor products. At present, major factors that may affect the operating speed of a device include the resistivity of conducting wires and parasitic capacitance of the inter-layer dielectric layer. To reduce wire resistance, low resistance metallic material is often used to form the conducting wires. To improve inter-layer parasitic capacitance, material having a low dielectric constant is frequently employed to form the insulation layer between metallic interconnects.

In general, conventional metallic interconnects are fabricated by forming a metal plug in a dielectric layer followed by depositing aluminum material over the metal plug to form an aluminum wire. Dual damascene technique is a low-cost, highly reliable method of fabricating metallic lines in an integrated circuit. Moreover, the metallic material for forming the-metallic interconnects in a dual damascene structure can be etched without much restriction. Hence, dual damascene techniques are frequently used to form low resistance copper wires for increasing the operating speed of circuit devices. As the level of integration of devices continues to increase, the use of low dielectric constant material to fabricate dual damascene structures is fast becoming the standard in the semiconductor industry.

FIGS. 1A through 1D are schematic cross-sectional views showing the progression of steps for fabricating a conventional dual damascene structure. As shown in FIG. 1A, a substrate 100 having a metallic layer 102 therein is provided. A dielectric layer 104, an etching stop layer 106 and a dielectric layer 108 are sequentially formed over the substrate 100. A photoresist layer 110 is next formed over the dielectric layer 108. Conventional photolithographic technique is applied to pattern the photoresist layer 110 so that location of a via opening is defined.

As shown in FIG. 1B, using the photoresist layer 110 as an etching mask, the dielectric layer 108, the etching stop layer 106 and the dielectric layer 104 are sequentially etched to form a via opening 112 that exposes the metallic layer 102. The photoresist layer 110 is removed and then another photoresist layer 114 is formed over the substrate 100. Conventional photolithographic technique is again applied to pattern the photoresist layer 114 so that location of a trench is defined.

As shown in FIG. 1C, while using the photoresist layer 114 as an etching mask and the etching stop layer 108 as an etching stop, the dielectric layer 108 is etched to form a trench 116. In the subsequent step, the photoresist layer 114 is removed and then, as shown in FIG. 1D, metal is deposited into the trench 116 and the via opening 112 to form a metallic layer 118. Ultimately, a dual damascene structure having a cross-sectional profile is formed.

As the level of integration continues to increase, parasitic capacitance that results from the inter-metal dielectric layer is intensified. In particular, low dielectric constant material is frequently employed to form the inter-metal dielectric layer in the manufacturing of deep sub-micron devices so that effects due to resistance-capacitance time delay are reduced. However, common photoresist material is composed of high molecular weight substances and most high dielectric constant material is composed of organic high molecular weight compounds. Consequently, in the photolithographic patterning of the photoresist layers 110 and 114, organic low dielectric constant material may react chemically with the photoresist material. The resultant products of the reactions may adhere to the surface of the dual damascene contact to form a residue that is impossible to remove in a subsequent cleaning operation. Furthermore, before the dielectric layer 108 is etched to form the trench 116, photoresist material is often deposited into the via opening 112 to serve as a hard mask so that the metallic layer 102 is protected. This photoresist material often reacts with nearby low dielectric constant material to form a residue. The residue damages the ideal profile of a dual damascene structure and affects the uniformity of a subsequently formed copper seeding layer. A non-linear copper seeding layer often result in the formation of low-quality copper lines.

SUMMARY OF THE INVENTION

Accordingly, one object of the present invention is to provide a method of forming a dual damascene structure capable of lowering a parasitic effect by using low dielectric constant material so that highly integrated device circuits are formed. In addition, the method is capable of preventing any chemical reaction between photoresist and dielectric material and thus avoids formation of difficult-to-remove residues on the sidewalls of via openings. Hence, an ideal profile of the dual damascene structure can be preserved.

To achieve these and other advantages and in accordance with the purpose of the invention, as embodied and broadly described herein, the invention provides a method of forming a dual damascene structure. A first dielectric layer, an etching stop layer, a second dielectric layer and a hard mask layer are sequentially formed over a substrate. Photolithographic and etching operations are conducted to remove portions of the hard mask layer, the second dielectric layer, the etching stop layer and the first dielectric layer so that a via opening is formed. A conformal dielectric layer is formed on the surface of the hard mask layer and the interior surface of the via opening. An anisotropic etching operation is carried out to remove the conformal dielectric layer from the surface of the hard mask layer and the bottom of the via opening so that spacers are formed on the sidewalls of the via opening. A patterned photoresist layer is formed over the hard mask layer. Using the patterned photoresist layer as a mask, a portion of the second dielectric layer is removed to form a trench. The patterned photoresist layer is removed. Conductive material is deposited over the substrate to fill the via opening and the trench. Finally, chemical-mechanical polishing is conducted to remove excess conductive material above the hard mask layer.

In the embodiment of this invention, the spacers serve as a partition that separates the photoresist material from the low dielectric constant material during photoresist coating and developing steps. Consequently, the low dielectric constant first and second dielectric layers are prevented from reacting with photoresist material and the intended dual damascene profile is preserved. The low dielectric constant layer can be a silicon oxide layer formed by low-pressure chemical vapor deposition.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
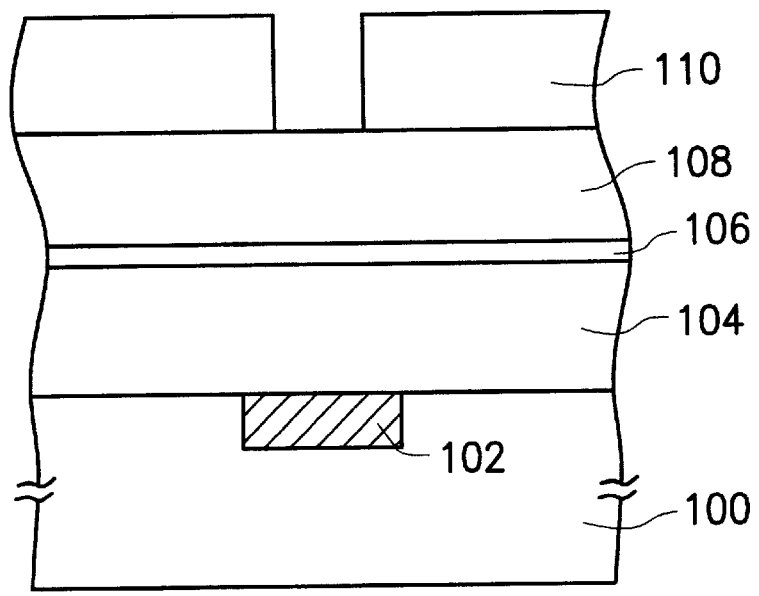
FIGS. 1A through 1D are schematic cross-sectional views showing the progression of steps for fabricating a conventional dual damascene structure.
Figure 1B:
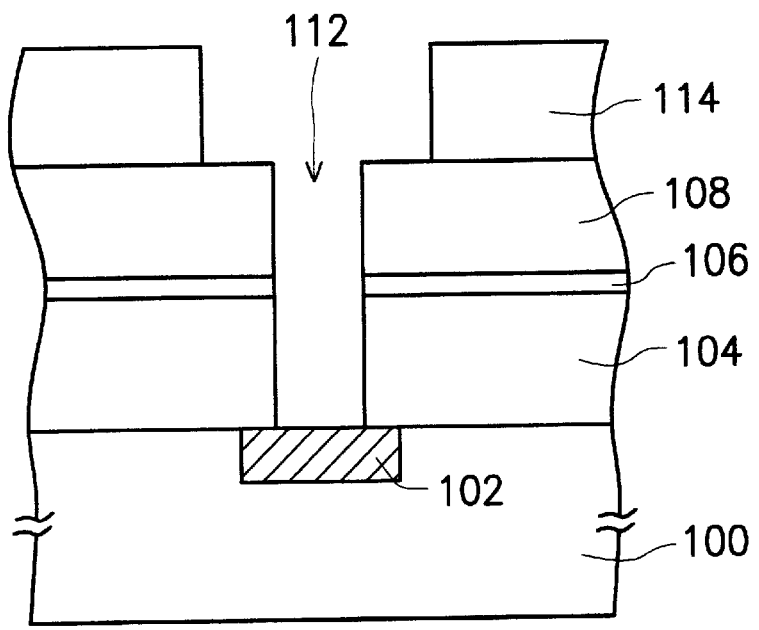
Figure 1C:
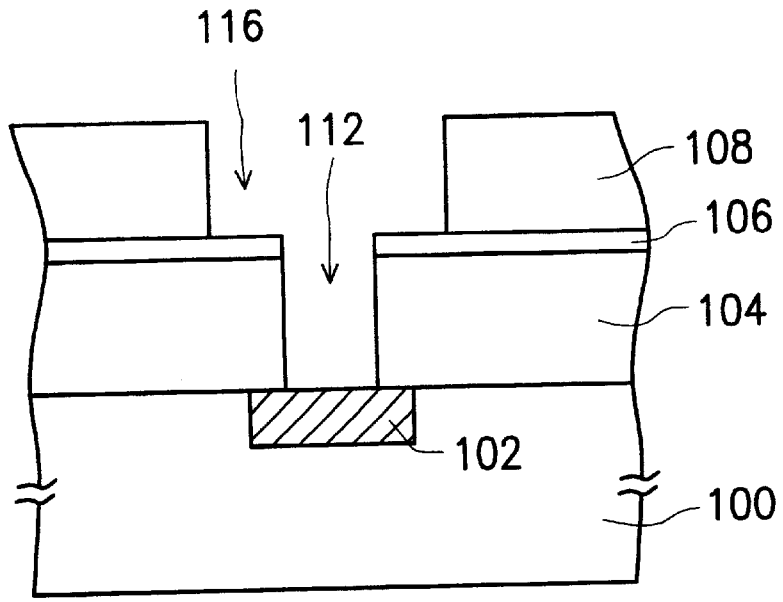
Figure 1D:
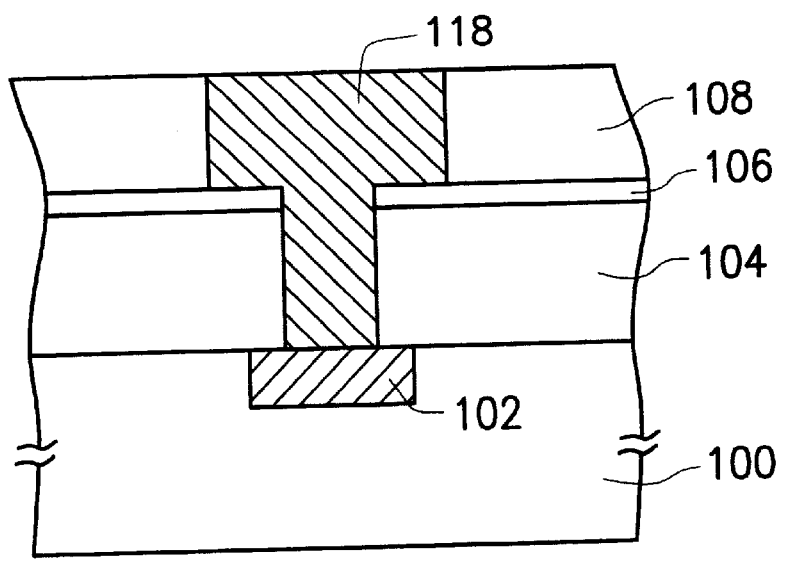

Reference will now be made in detail to the present preferred embodiments of the invention, examples of which are illustrated in the accompanying drawings. Wherever possible, the same reference numbers are used in the drawings and the description to refer to the same or like parts.

Figure 2A:
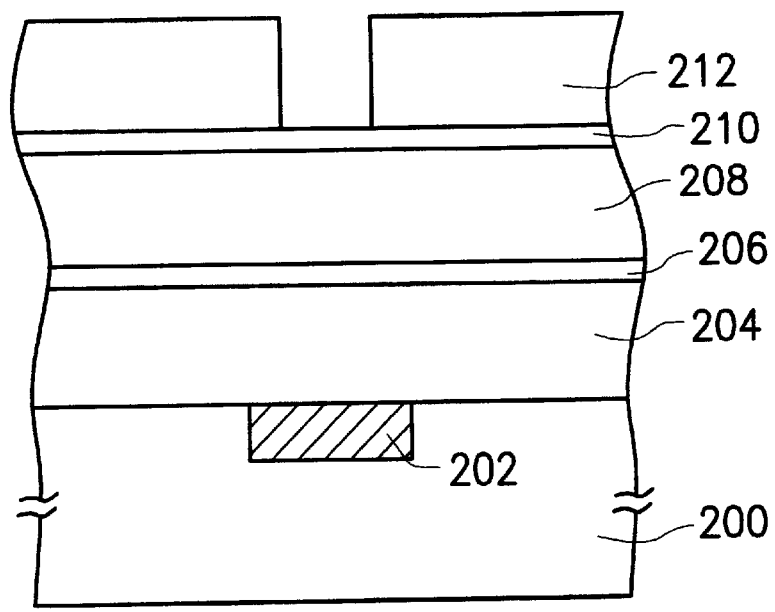
FIGS. 2A through 2G are schematic cross-sectional views showing the progression of steps for fabricating a dual damascene structure according to one preferred embodiment of this invention.

FIGS. 2A through 2G are schematic cross-sectional views showing the progression of steps for fabricating a dual damascene structure according to one preferred embodiment of this invention. As shown in FIG. 2A, a substrate 200 having a conductive layer 202 therein is provided. A dielectric layer 204 is formed over the substrate 200. The dielectric layer 204 is planarized to a thickness equal to the desired depth of a via. An etching stop layer 206 and a dielectric layer 208 are sequentially formed over the dielectric layer 204. The dielectric layer 208 is planarized to a thickness equal to the desired depth of a metallic layer (a metallic line) in a dual damascene structure. A hard mask layer 210 is formed over the dielectric layer 208.

The dielectric layers 204 and 208 can be low dielectric constant organic spin on polymer (SOP) material such as Flare, SILK, Parylene and PAE-II. The etching stop layer 206 serves as an etching stop in a subsequent trench-forming etching operation. Hence, the etching stop layer 206 is preferably a silicon oxide layer, a silicon nitride layer or a silicon oxynitride layer formed, for example, by chemical vapor deposition. The hard mask layer 210 is a layer that prevents any chemical reaction between subsequently deposited photoresist material and the dielectric layers 208 and 206 to form a hard-to-remove residue. Therefore, the hard mask layer 210 is preferably a silicon oxide layer, a silicon nitride layer or a silicon oxynitride layer formed, for example, by chemical vapor deposition.

A photoresist layer is formed over the hard mask layer 210. Conventional photolithographic and etching techniques are employed to form a photoresist layer 212 having a via opening pattern therein. During the patterning step, the photoresist material is prevented from reacting with the dielectric layer 208 by the hard mask layer 210.

Figure 2B:
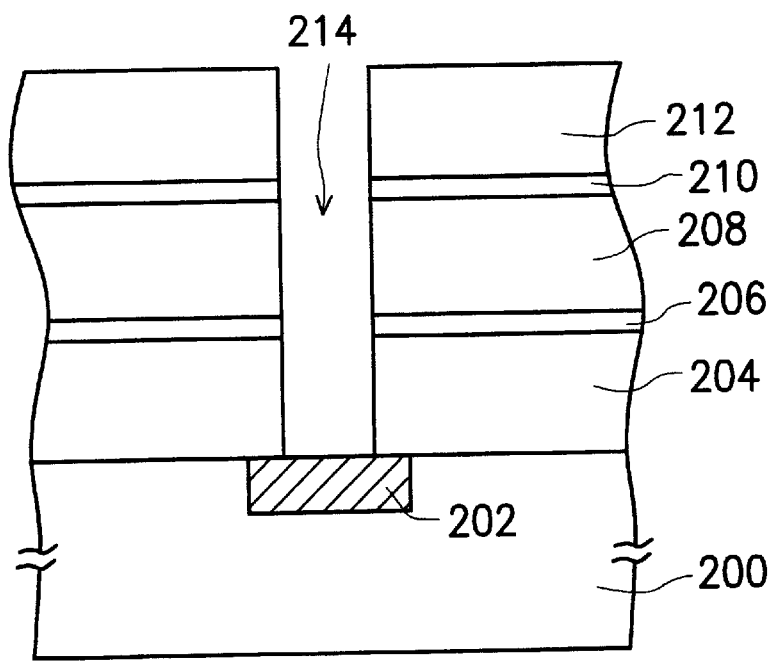

As shown in FIG. 2B, the hard mask layer 210, the dielectric layer 208, the etching stop layer 206 and the dielectric layer 204 are sequentially etched to form a via opening 214 while using the photoresist layer 212 as an etching mask.

Figure 2C:
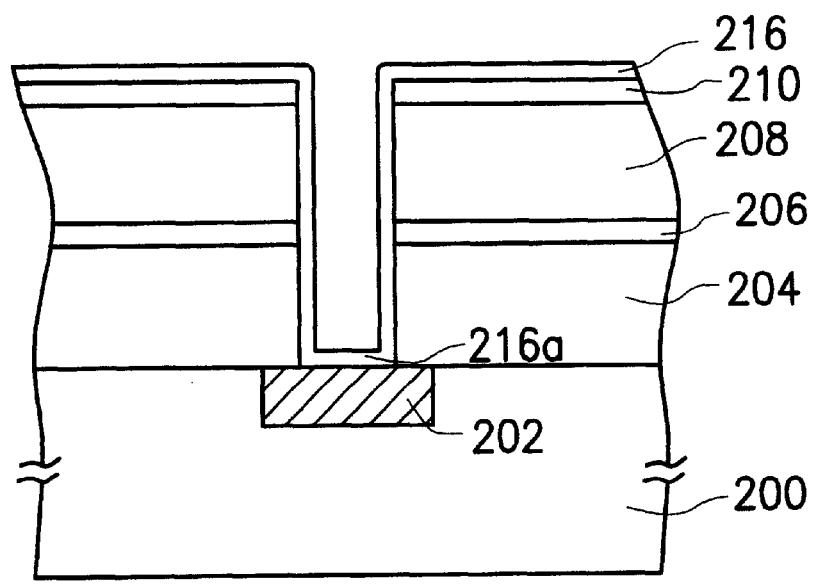

As shown in FIG. 2C, the photoresist layer 212 is removed. A conformal dielectric layer 216 is coated over the surface of the hard mask layer 210 and the interior surface of the via opening 214.

Figure 2D:
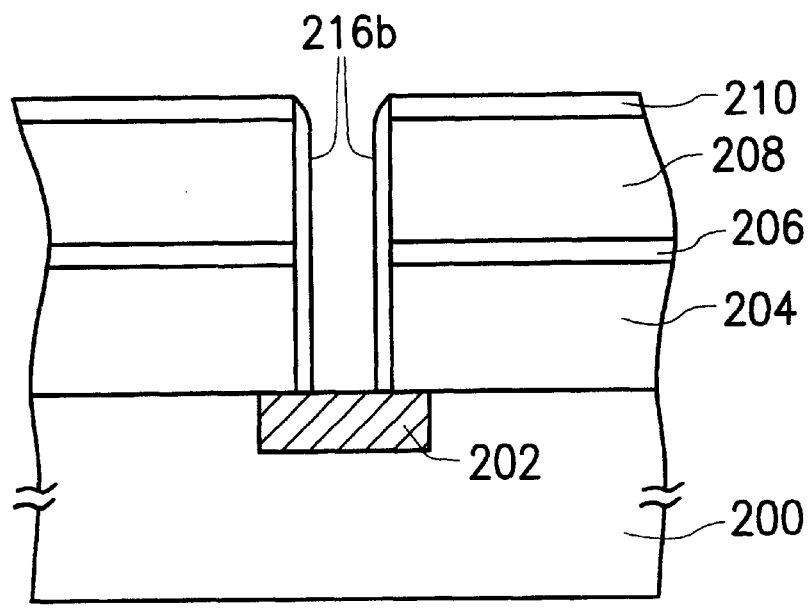

As shown in FIG. 2D, an anisotropic etching of the dielectric layer 216 is carried out to remove a portion of the dielectric layer 216 on the surface of the hard mask layer 210 and the dielectric layer 216a at the bottom of the via opening 214. Ultimately, a dielectric spacer 216b is formed on the sidewalls of the via opening 214. The dielectric spacer 216b serves as a partition preventing any chemical reaction between subsequently deposited photoresist material and the dielectric layers 204 and 208. As a result of this partitioning, difficult-to-remove chemical residue is not produced. The dielectric spacers 216b are preferably silicon oxide layers formed, for example, by low-pressure chemical vapor deposition so that a dielectric layer conformal to the profile of the via opening 214 can easily form.

Figure 2E:
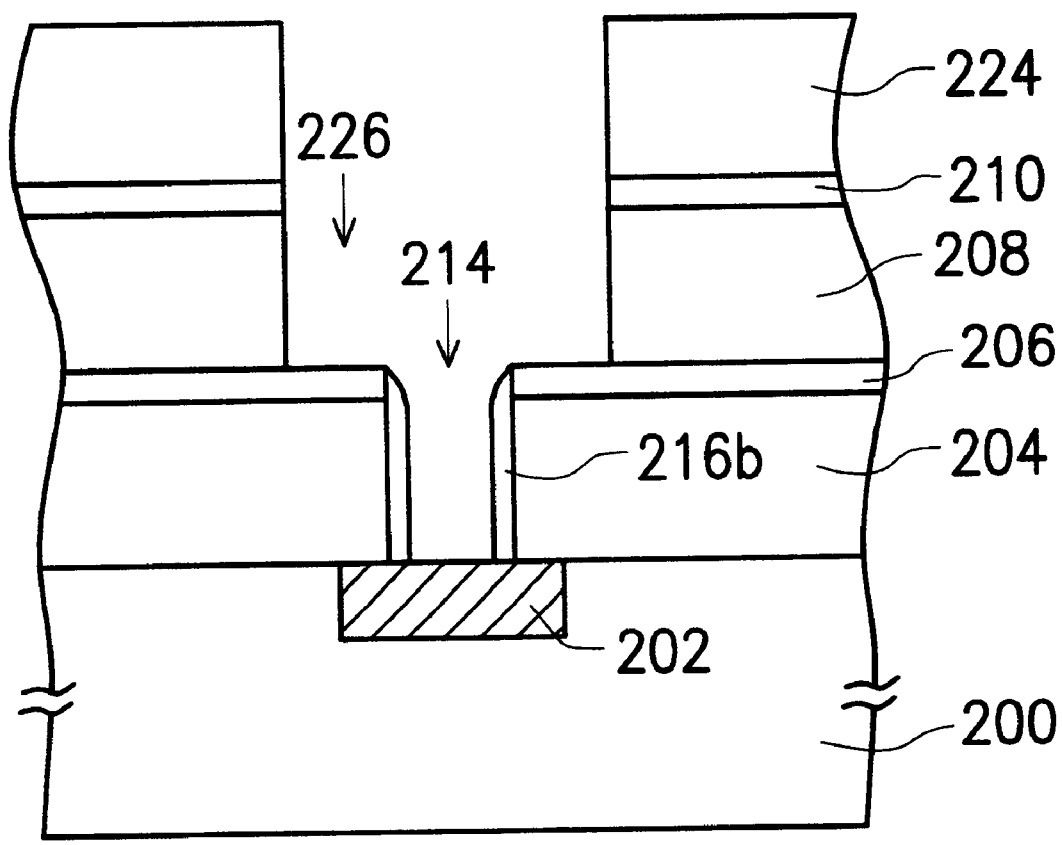

As shown in FIG. 2E, another photoresist layer is formed over the hard mask layer 210. Conventional photolithographic and etching techniques are used to pattern the photoresist layer into a photoresist layer 224 having a trench pattern for patterning the dielectric layer 208 and the hard mask layer 210. In the patterning step, the spacers 216b on the sidewalls 222 of the via opening 214 prevent any reaction between the photoresist material and the dielectric layers 204 and 208. With the sidewalls 222 of the dielectric layers 204 and 208 protected by the spacers 216b, the desired via opening 214 profile can be preserved. Using the photoresist layer 224 as an etching mask and the etching stop layer 206 as an etching stop, a dry etching operation is conducted. Ultimately, the hard mask layer 210 and dielectric layer 208 not covered by the photoresist layer 224 are removed to form a trench 226.

Figure 2F:
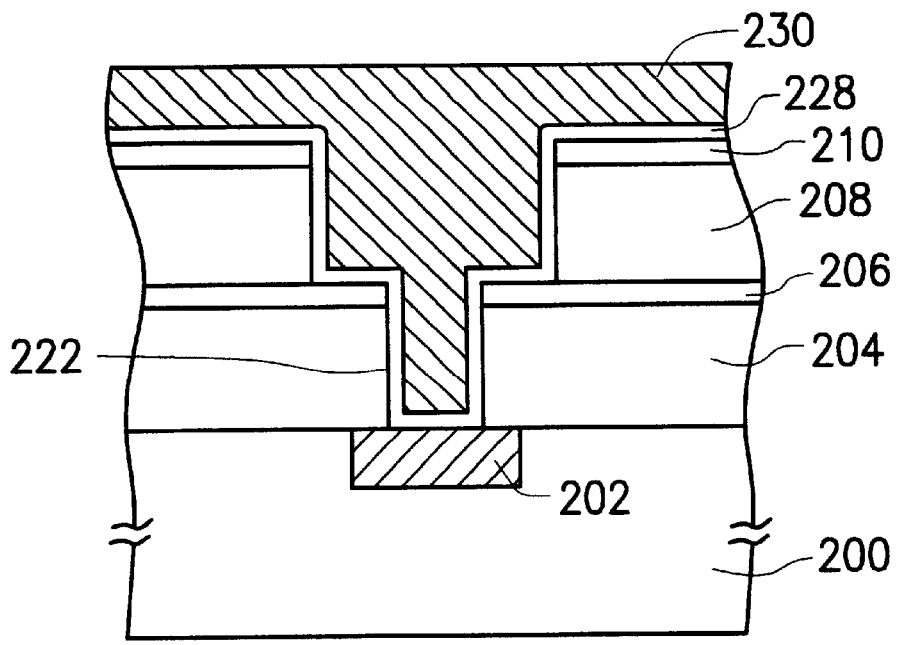
Figure 2G:
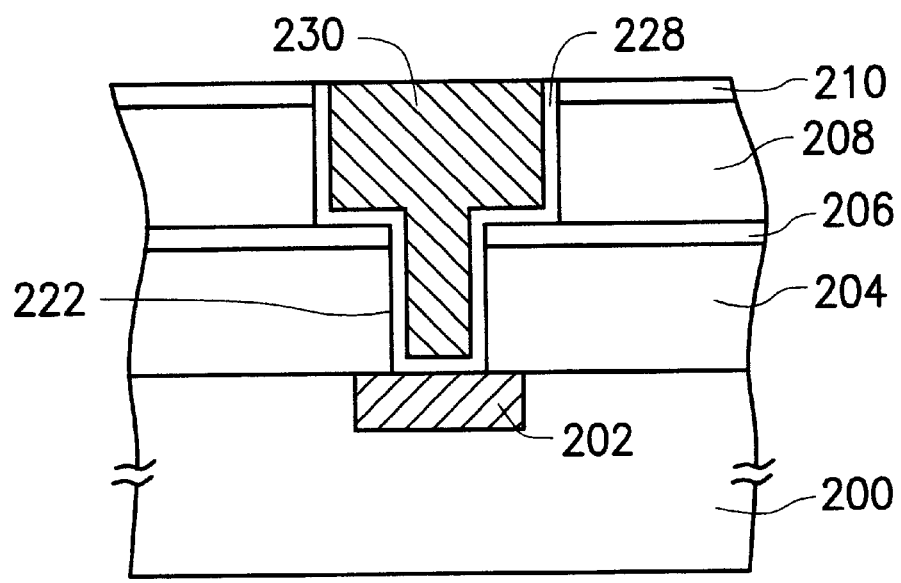

As shown in FIG. 2F, the photoresist layer 224 is removed. The spacers 216b are next removed by wet etching. Conductive material is deposited over the substrate 200 to fill the via opening 214 and the trench 216, thereby forming a conductive layer 230. The conductive layer 230 can be a metallic layer such as a tungsten layer, an aluminum layer or a copper layer formed, for example, by chemical vapor deposition. Preferably, a conformal adhesive layer or barrier layer 228 is deposited over the substrate 200 before forming the conductive layer 230. This adhesive or barrier layer 228 not only increases the adhesion between the metallic layer and the dielectric layers 204 and 208, but also prevents the diffusion of metallic ions into the dielectric layers 204 and 208. Material forming the adhesive/barrier layer 228 includes titanium/titanium nitride, tantalum, tantalum nitride, tungsten nitride, titanium nitride and tantalum silicon nitride. After the conductive layer 230 is formed, a chemical-mechanical polishing operation is conducted to planarize the conductive layer 230 and remove excess conductive material and adhesive/barrier layer material above the hard mask layer 210. Ultimately, a dual damascene structure as shown in FIG. 2G is formed.

One major aspect of this invention is the formation of a conformal dielectric spacers on the sidewalls of the via opening preventing any chemical reaction between photoresist material and dielectric material to produce difficult-to-remove products. Hence, the desired via opening profile is formed.

In summary, one advantage of this invention includes the invention's capacity to use low dielectric constant material to reduce parasitic capacitance and increase operating speed of devices suitable for forming highly integrated circuits. Another advantage of this invention is the invention's capacity to preserve the trench and via opening profile of a dual damascene structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure over a substrate, the substrate having a metal layer formed thereon, comprising the steps of:

forming a first dielectric layer over the substrate;

forming a etching stop layer over the first dielectric layer;

forming a second dielectric layer over the etching stop layer;

forming a hard mask layer over the second dielectric layer;

forming a patterned first photoresist layer on the hard mask layer;

removing a portion of the hard mask layer, the second dielectric layer, the etching stop layer and the first dielectric layer by using the patterned first photoresist layer as a mask to form an via opening, wherein a portion of the metal layer is exposed within the via opening;

removing the patterned first photoresist layer;

forming a conformal third dielectric layer on a sidewall of the via opening and on the hard mask layer;

etching a portion of the third dielectric layer to form a dielectric spacer on the sidewall of the via opening, wherein a portion of the third dielectric layer at a bottom of the via opening is removed until a portion of the metal layer is exposed;

forming a patterned second photoresist layer on the hard mask layer;

removing a portion of the hard mask layer and the second dielectric layer by using the patterned second photoresist layer as a mask to form a trench;

removing the patterned second photoresist layer;

removing the dielectric spacer; and forming a conductive layer to fill the via opening, whereby the dual damascene structure.

2. The method of claim 1, wherein material forming the first and the second dielectric layer includes a spin on polymer.

3. The method of claim 1, wherein the steps of forming the first dielectric layer and the second dielectric layer are by chemical vapor deposition.

4. The method of claim 2, wherein the spin on polymer is selected from a group organic materials that includes Flare, SILK, Parylene and PAE-II.

5. The method of claim 1, wherein the step of forming the etching stop layer includes forming a layer of material selected from a group of silicon nitride, silicon dioxide and silicon oxynitride.

6. The method of claim 1, wherein the step of forming the hard mask layer includes forming a layer of material selected from a group of silicon nitride, silicon dioxide and silicon oxynitride.

7. The method of claim 1, wherein the step of forming the conformal third dielectric layer includes forming a silicon dioxide layer by performing a low-pressure chemical vapor deposition.

8. The method of claim 1, wherein the step of etching a portion of the third dielectric layer includes anisotropic etching.

9. A method of forming an opening over a substrate, wherein the substrate comprising a metal layer, a first dielectric layer covering the metal layer, a etching stop layer and a second dielectric layer sequentially formed over the first dielectric layer, wherein a first opening is formed therein exposing a portion of the metal layer, the method comprising:

forming a conformal third dielectric layer on a sidewall of the first opening and the second dielectric layer;

etching a portion of the third dielectric layer to form dielectric spacers on the sidewall of the first opening, wherein a portion of the third dielectric layer at a bottom of the via opening is removed until a portion of the metal layer is exposed;

forming a patterned photoresist layer over the second dielectric layer;

removing a portion of the second dielectric layer to form a second opening in the first dielectric layer while using the patterned photoresist layer as a mask; and removing the patterned photoresist layer.

10. The method of claim 9, wherein material forming the first and the second dielectric layer includes a spin on polymer.

11. The method of claim 9, wherein the step of forming the conformal third dielectric layer includes forming a silicon dioxide layer by performing a low-pressure chemical vapor deposition.

12. The method of claim 9, wherein the steps of forming the first dielectric layer and the second dielectric layer are by chemical vapor deposition.

13. The method of claim 10, wherein the spin on polymer is selected from a group organic materials that includes Flare, SILK, Parylene and PAE-II.

14. A method of forming a dual damascene structure a substrate, wherein the substrate comprising a metal layer, a first dielectric layer covering the metal layer, a etching stop layer and a second dielectric layer sequentially formed over the first dielectric layer, wherein a via opening is formed therein exposing a portion of the metal layer, the method comprising:

forming a dielectric spacer on a sidewall of the via opening, wherein a portion of the metal layer at a bottom remain exposed;

forming a patterned photoresist layer over the second dielectric layer to expose the via opening and a portion of the second dielectric layer;

removing a portion of the second dielectric layer to form a trench in the second dielectric layer by using the patterned photoresist layer as a mask, wherein the trench and the via opening forms a dual damascene trench;

removing the patterned photoresist layer;

removing the dielectric spacer; and filling a conductive layer in the dual damascene trench to form the dual damascene structure.

15. The method of claim 14, wherein material forming the first and the second dielectric layer includes organic material.

16. The method of claim 14, wherein material forming the first and the second dielectric layer includes a spin on polymer.

17. The method of claim 16, wherein the spin on polymer is selected from a group organic materials that includes Flare, SILK, Parylene and PAE-II.

18. The method of claim 14, wherein the step of forming the dielectric spacer comprising the steps of:

forming a conformal third dielectric layer on the sidewall of the via opening and the second dielectric layer; and anisotropically etching a portion of the third dielectric layer to form the dielectric spacer on the sidewall of the via opening, wherein a portion of the third dielectric layer at a bottom of the via opening is removed until a portion of the metal layer is exposed.

19. The method of claim 14, wherein the step of removing the dielectric spacer includes wet etching.

* * * * *